United States Patent [19]

Kyrian et al.

[11] Patent Number: 4,864,635
[45] Date of Patent: Sep. 5, 1989

[54] AMPLITUDE MODULATED BROADCAST TRANSMITTER

[75] Inventors: Bohumil Kyrian, Unterbözberg; Wilhelm Tschol, Fislisbach, both of Switzerland

[73] Assignee: BBC Brown Boveri AG, Baden, Switzerland

[21] Appl. No.: 119,542

[22] Filed: Nov. 12, 1987

[30] Foreign Application Priority Data

Nov. 20, 1986 [CH] Switzerland .................. 4660/86

[51] Int. Cl.$^4$ .................. H04B 1/02; H03C 1/00
[52] U.S. Cl. .................. 455/108; 455/116; 332/157
[58] Field of Search .................. 455/102, 108, 116; 332/31 R, 38, 41, 64

[56] References Cited

U.S. PATENT DOCUMENTS

| 4,058,769 | 11/1977 | Alderman | 455/108 |
| 4,088,956 | 5/1978 | Axman | 455/108 |
| 4,295,106 | 10/1981 | Kahn | 332/38 X |
| 4,449,103 | 5/1984 | Kyrian | 455/108 X |
| 4,481,672 | 11/1984 | Watkinson | 455/108 |
| 4,633,512 | 12/1986 | Kyrian | 455/108 |
| 4,646,359 | 2/1987 | Furrer | 455/108 |

FOREIGN PATENT DOCUMENTS

| 0025234 | 3/1981 | European Pat. Off. |
| 2060297 | 4/1981 | United Kingdom |
| 2117589 | 10/1983 | United Kingdom |
| 2150378 | 6/1985 | United Kingdom |

OTHER PUBLICATIONS

*Brown Boveri Review;* vol. 72, No. 5; May 1985; "High-power Pulse Step Modulator for 500 kW Shortwave and 600 kW Medium-wave Transmitters"; W. Schminke; pp. 235-240.

*Primary Examiner*—Robert L. Griffin
*Assistant Examiner*—Ralph E. Smith
*Attorney, Agent, or Firm*—Oblon, Spivak, McClelland, Maier & Neustadt

[57] ABSTRACT

In an AM broadcast transmitter having a switching amplifier as main modulator (12), an additional modulator (18) is used in the radio frequency circuit in order to achieve a steady 100% modulation at the modulation minima, with the aid of which additional modulator the carrier signal is also modulated at the modulation minima. The LF signal needed for controlling the additional modulator (18) passes through a delay circuit (16) and a correction circuit (17).

9 Claims, 3 Drawing Sheets

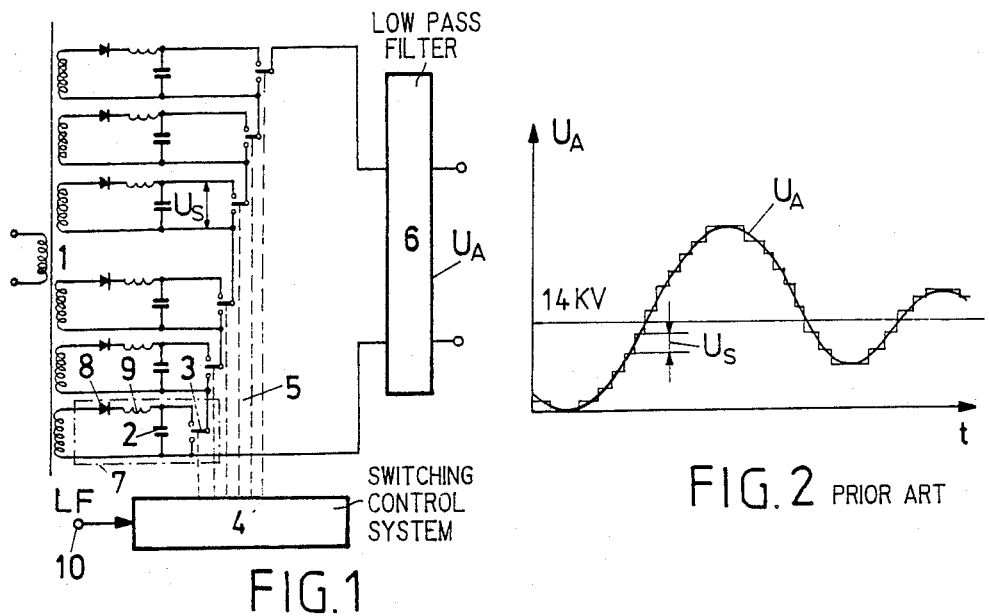
FIG.1
FIG.2 PRIOR ART
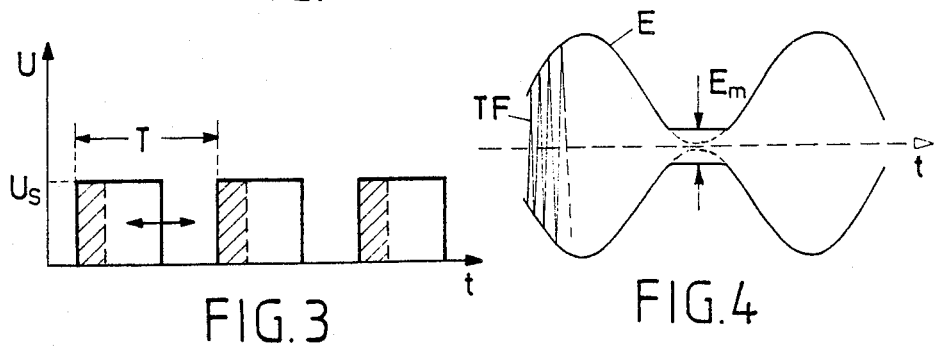
FIG.3
FIG.4
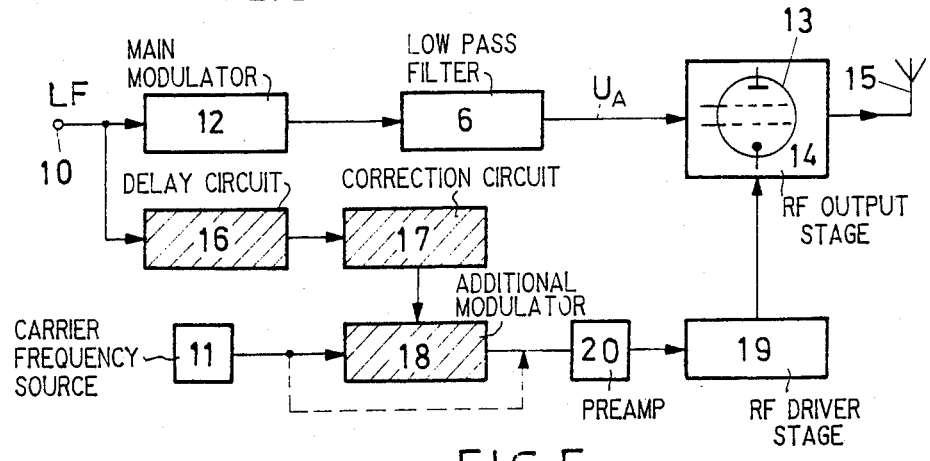
FIG.5

AMPLITUDE MODULATED BROADCAST TRANSMITTER

TECHNICAL FIELD

The invention relates to the field of broadcast engineering. In particular, it concerns amplitude modulated broadcast transmitters (AM broadcast transmitters) having an RF output stage which is equipped with at least one output stage tube;

a main modulator in the form of a switching amplifier which outputs an anode voltage, modulated as determined by an LF input signal, to the output stage tube; and a radio frequency circuit with a carrier frequency source for generating a carrier signal and a subsequent driver stage which amplifies the carrier signal and passes it to a control grid of the output stage tube.

PRIOR ART

In amplitude modulated high power broadcast transmitters, for example short or medium wave transmitters of several 100 kW transmitting power, the achievable efficiency is of great importance for the operating costs. In particular, the construction and the mode of operation of the modulator used has a decisive significance for the efficiency.

The latest policy has therefore been to replace the class B push-pull modulator equipped with two high power tubes normally used until now with a semiconductor-equipped switching amplifier which either operates with pulse duration modulation (PDM) (see, for example, EP-B1 0 025 234) or is constructed as so called pulse step modulator (PSM) (see, for example, Brown Boveri Review 5 (1985), pages 235–240).

In both cases, the power amplification of the LF input signal necessary for the modulation is no longer performed by means of a linear amplifier but by means of a time-controlled switching on and off of switching stages with an output voltage which remains the same. The amplified analog signal is then recovered by means of a lowpass filter located at the output of the switching amplifier.

In the case of the PDM modulator, the duration-modulated pulses cannot become shorter than a minimum pulse duration due to the finite switching times of the switching elements used (for example thyristors). The result is that, when the modulation is actually 100% (m=1), the required zero value of the RF output power cannot be achieved at minimum modulation, that is to say at the minimum of the LF input signal, because the switching amplifier outputs a minimum modulation power to the RF output stage below which it cannot go. 100% full modulation can therefore not be achieved with this type of modulator.

The same considerations also apply to the PSM modulator because, in addition to the coarse stairsteplike approximation of the required output voltage variation by the (for example 32) switching stages, a fine approximation is also performed with the aid of a superimposed pulse duration modulation.

REPRESENTATION OF THE INVENTION

The present invention then has the object of creating an amplitude modulated broadcast transmitter which exhibits the advantages which can be achieved by means of a modulator constructed as switching amplifier and, at the same time, can be fully modulated at 100%.

In an AM broadcast transmitter of the type initially mentioned, the object is achieved by the fact that, in order to realize up to 100% modulation, even at the modulation minima, means are provided by means of which the zero value of the RF output voltage output by the RF output stage can be continuously attained at a modulation minimum via control of the carrier signal as determined by the LF input signal.

Thus, the core of the invention consists in modulating, in addition to the known modulation of the anode voltage for the output stage tube, also the carrier signal at modulation minima with approximately 100% modulation in order to continuously set by this means the zero value of the RF output voltage via the control grid of the output stage tube.

This additional modulation of the carrier signal is preferably performed by means of an additional modulator which is disposed in the radio frequency circuit immediately behind the carrier frequency source.

In this arrangement, the LF input signal necessary for controlling the additional modulator is picked up, in particular, directly at the input of the main modulator and applied to the additional modulator via a delay circuit which delay circuit compensates for the signal transit time in the main modulator.

It is also particularly advantageous to dispose between the delay circuit and the additional modulator a correction circuit which, in particular, compensates for nonlinearities of the RF output stage and of the additional modulator and predetermines a starting point for the additional modulation of the carrier signal in the additional modulator, from which this modulation starts.

BRIEF DESCRIPTION OF THE DRAWINGS

In the text which follows, the invention will be described and explained in greater detail with the aid of illustrative embodiments, in conjunction with the drawing, in which:

FIG. 1 shows the basic configuration of a known PSM modulator;

FIG. 2 shows the output voltage of a modulator according to FIG. 1, with stairstep-like approximation of an illustrative signal variation;

FIG. 3 shows a diagram of the pulse duration modulation in a switching amplifier, FIG. 4 shows an illustrative modulated RF output voltage with odulation minimum;

FIG. 5 shows a block diagram of a preferred embodiment of the broadcast transmitter according to the invention;

APPROACHES TO CARRYING OUT THE INVENTION

Figure 6:
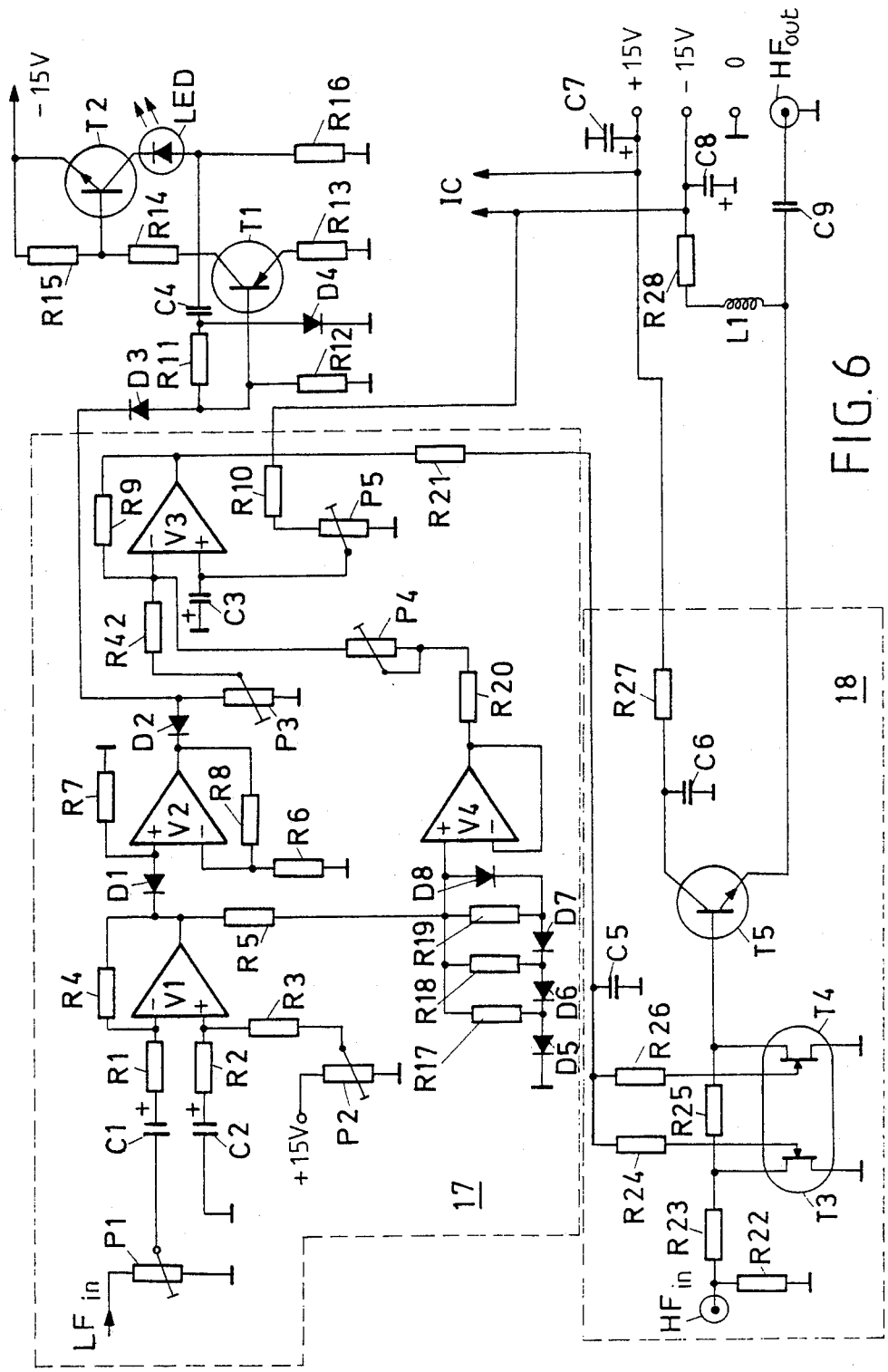
FIG. 6 shows a detailed circuit of a successful embodiment of the additional modulator and of the correction circuit according to FIG. 5.

The explanations following are based on the example of a broadcast transmitter with PSM modulator without restriction of the generality.

The basic circuit diagram of such a PSM modulator, as it is known from the printed document Brown Boveri Review initially mentioned, is shown in FIG. 1. The central part of the modulator is a switching amplifier consisting of a plurality of similar switching stages 7.

Each switching stage 7 has an approximately constant output voltage $U_S$ which determines the height of the stairsteps in the approximation of a steady signal variation (FIG. 2). To generate this output voltage $U_S$, each switching stage 7 is connected to a separate secondary winding of a power system transformer 1, the primary of which is operated, for example, across a medium voltage system (3 ... 24 kV).

The alternating voltage of each secondary coil is rectified in each switching stage by means of a rectifier 8 and smoothed by a combination of smoothing choke 9 and capacitor bank 2. The switching stages 7 can be successively connected in series or disconnected from the series circuit by corresponding change-over switches 3 at their output.

The change-over switches 3 are controlled as determined by an LF input signal present at an LF input 10 by a switching stage control system 4 via potential-isolating optical wave guides 5.

The summed output voltages $U_S$ of the seriesconnected switching stages 7 are supplied to a lowpass filter 6 through which the steady analog signal is recovered in amplified form. The stairstep-like voltage before and the smooth output voltage $U_A$ after the lowpass filter 6 are shown together in FIG. 2 in an illustrative curve trace. The output voltage $U_A$ here fluctuates around a mean value of 14 kV.

In a broadcast transmitter of known type, the block diagram of which can be seen in FIG. 5 if the function blocks drawn shaded in this figure are omitted, the switching amplifier according to FIG. 1 is used as main modulator 12 with the subsequent lowpass filter 6. The output voltage $U_A$ is used as modulated anode voltage for an output stage tube 13, in most cases a high power tetrode, used in the subsequent RF output stage 14.

The carrier frequency, the amplitude of which is to be modulated with the LF input signal, originates from a carrier frequency source 11, an oscillator or frequency synthesizer. The carrier signal from the carrier frequency source 11 is amplified (passing along the path drawn with a dashed line) in a preamplifier 20 and an RF driver stage 19 and then applied to a control grid of the output stage tube 13 in the RF output stage 14.

The preamplifier 20 is in most cases a wideband transistor amplifier and the RF driver stage is frequently equipped with a driver tube. Together with the carrier frequency source 11 and the RF output stage 14, they form a radio frequency circuit the more detailed construction of which can be seen, for example, in the printed document Brown Boveri Review 5/6 (1983), pages 235–240.

As has already been mentioned, the relatively low number of switching stages in the switching amplifier (for example 32) means that a fine approximation of the steady signal must be provided by additional pulse duration modulation in order to achieve a smoother curve variation. At least one of the switching stages in the series circuit therefore outputs the pulses shown in FIG. 3, having the period T and variable pulse duration (indicated by the dual arrow). In this pulse duration modulation mode, the pulse duration cannot drop below the minimum pulse duration drawn shaded because of the finite switching times of the switching elements used.

This means that, differently from the idealized case shown in FIG. 2, the value $U_A = 0$ cannot be continuously achieved at a modulation minimum with 100% modulation. On the output side of the transmitter, at the antenna 15, there is therefore a signal according to FIG. 4 present in which the carrier frequency TF exhibits an envelope E which does not follow the curve (drawn with a dashed line) for 100% modulation at the minimum but only assumes a finite minimum value $E_m$. Since such a curve variation, however, is equivalent to additional distortion, 100% full modulation could not, therefore, be used in transmitters of the prior art and the modulation could only extend to a percentage at which the minimum value $E_m$ of the envelope was reached in each case at the modulation minima.

In order to be able to retain the main modulator 12 in the form of the switching amplifier unchanged with all its advantages and, nevertheless, provide the possibility of steady 100% full modulation, the carrier signal is additionally modulated in the radio frequency circuit, that is to say greatly reduced, at the critical points of the modulation minima when the minimum value $E_m$ of the envelope is reached, according to the invention. The RF output signal can be further reduced in this manner at the modulation minimum via the control grid of the output stage tube 13 even though the anode voltage $U_A$ remains constant at its minimum value. The combined modulation via the anode voltage and the carrier signal thus allows 100% modulation without any disadvantages.

In the preferred embodiment of the invention according to FIG. 5, an additional modulator 18 is inserted into the radio frequency circuit immediately behind the carrier frequency source 11 (the dashed line has no significance in this case) for the additional modulation of the carrier signal.

The LF signal needed for controlling the additional modulator 18 is picked up directly at the input of the main modulator 12, that is to say after the input filters which may be present at the LF input 10. Since the main modulator 12 has a relatively long signal transit time but the two modulations must occur matched to each other in time, a delay circuit 16 must first be inserted before the additional modulator 18 which compensates for the signal transit time caused by the main modulator 12, particularly at higher modulation frequencies.

In addition to the delay in the delay circuit 16, the LF signal must be precorrected in a correction circuit 17, for the following reasons:
nonlinearity of the RF output stage 14
nonlinearity of the additional modulator 18
starting point of the additional modulation only in the region of high modulation
minimum influence on $I_{g1}$ of the output stage tube 13
no additional spurious radiation in the RF spectrum.

The detailed circuits of successful embodiments of the additional modulator 18 and of the correction circuit 17 are shown in FIG. 6.

The actual additional modulator 18 consists of a two-stage controllable attenuator with the dual field effect transistor T3, T4 followed by an impedance converter with the transistor T5 in order to avoid any unspecifiable loading of the attenuator by the subsequent preamplifier 20.

The correction circuit 17 is constructed as nonlinear amplifier with the operational amplifiers V1 to V4. For the above reasons, only relatively narrow negative peaks are needed for the additional modulation of the carrier signal, but without any irregular transitions.

Assuming a sinusoidal modulation signal (see, for example, FIG. 4), the upper portion of the sine wave is severely compressed by the nonlinear resistance of the diodes D5 to D8.

The shape of the negative peaks can be influenced by an addition of even narrower sinusoidal peaks which are obtained by the diodes D1, D2 and the operational amplifier V2 and the amplitude of which can be adjusted by means of the potentiometer P3 in order to achieve an improvement in the total harmonic distortion with 100% modulation.

The transistors T1 and T2 and the LEDs form an indicating circuit. The LED is illuminated when 100% modulation is reached, driven by a monostable flip flop formed by the transistors T1 and T2 with a sufficiently long conduction period at each modulation peak. This indicating circuit is mainly used as adjustment aid.

The potentiometer P1 is used for setting the LF input level and the potentiometer P2 is used for setting the required starting point. Matching the modulation characteristic of the transistors T3, T4 and thus the required shape of the envelope is then achieved by means of potentiometers P4 and P5.

The additional modulator 18 has a frequency range of up to 30 MHz.

Figure 7:
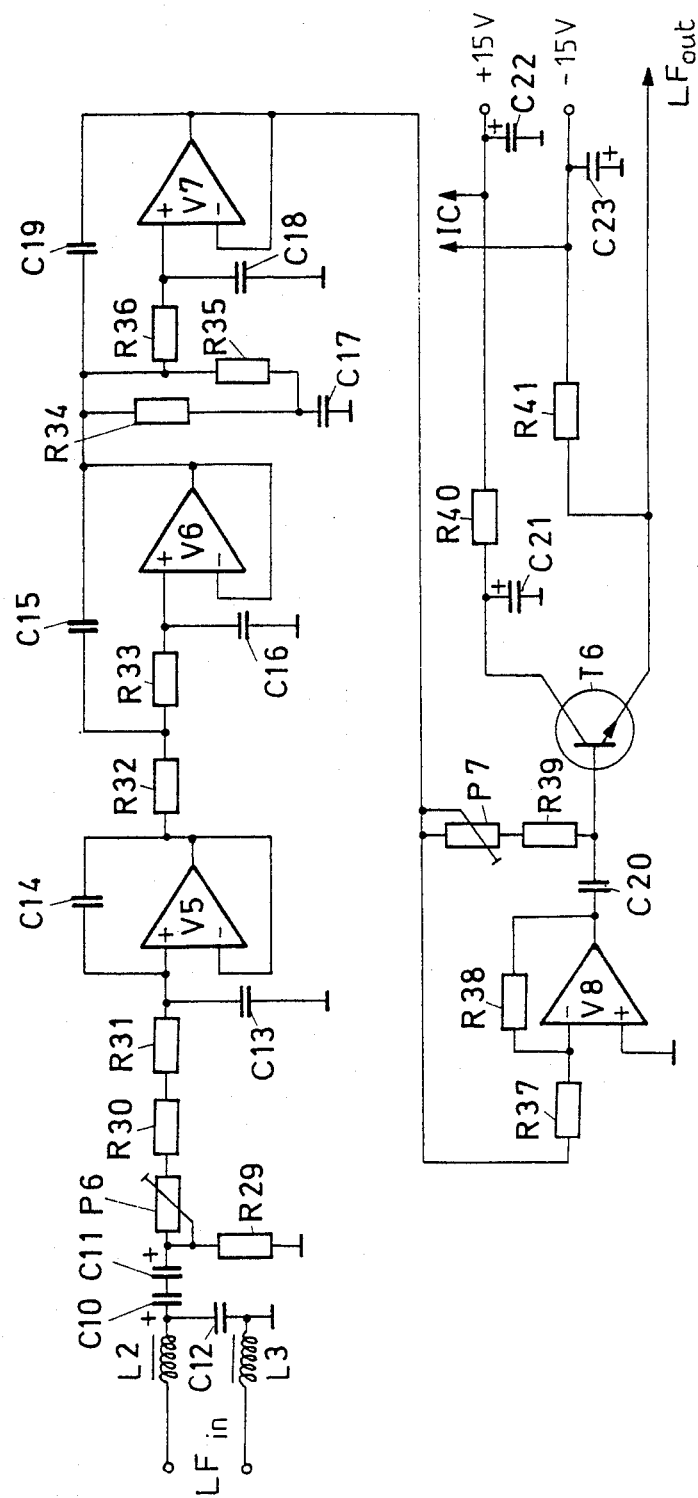
FIG. 7 shows a detailed circuit of a successful embodiment of the delay circuit according to FIG. 5.

The detailed circuit of a successful embodiment of the delay circuit 16 is shown in FIG. 7. Since a traditional delay line for the required delay times and the LF range is too expensive, the delay circuit of FIG. 7 is constructed as three-stage active lowpass filter combined with an adjustable all-pass filter.

These 3 stages of the lowpass filter are implemented by means of the operational amplifiers V5 to V7. The potentiometer P6 can be used for correcting, as required, the amplitude characteristic at higher frequencies and the potentiometer P7 is used for setting the coincidence between main and additional modulator at about 4 kHz.

The delay circuit according to FIG. 7 results in the required delay in the frequency range from 50 Hz to 5 kHz.

Commercially available components of suitable size can be used for the operational amplifiers V1, ..., V8, the transistors T1, ..., T6, the diodes D1, ..., D8, the resistors R1, ..., R42, the capacitors C1, ..., C23 and the potentiometers P1, ..., P7 of the circuits of FIGS. 6 and 7.

Overall, the invention results in an AM broadcast transmitter which exhibits the advantages of modulation by means of a switching amplifier and, at the same time, can be fully and continuously modulated up to 100%.

We claim:

1. Amplitude modulated broadcast transmitter comprising:
   (a) an RF output stage having at least one output stage tube;
   (b) a main modulator in the form of a switching amplifier, which outputs an anode voltage, modulated as determined by an LF input signal, to the output stage tube;
   c) a radio frequency circuit with a carrier frequency source for generating a carrier signal and a subsequent RF driver stage which amplifies the carrier signal and passes it to a control grid of the output stage tube; and
   control means connected between the carrier frequency source and the RF output stage for controlling the carrier signal based on the LF input signal so that, even at a modulation minimum, a zero value of the RF output voltage output by said RF output stage can be continuously achieved in order to realize up to 100% modulation of the carrier signal even at said modulation minimum.

2. Amplitude modulated broadcast transmitter as claimed in claim 1, wherein the control means comprises an additional modulator (18) inserted into the radio frequency circuit.

3. Amplitude modulated broadcast transmitter as claimed in claim 2, wherein the additional modulator has an input connected to the carrier signal generated by the carrier frequecy source.

4. Amplitude modulated broadcast transmitter as claimed in claim 2, wherein the LF input signal, for controlling the additional modulator, is applied to the additional modulator (18) via a delay circuit which delay circuit (16) compensates for a signal transit time through the main modulator.

5. Amplitude modulated broadcast transmitter as claimed in claim 4, wherein the LF input signal for the additional modulator is picked up directly at the input of the main modulator.

6. Amplitude modulated broadcast transmitter as claimed in claim 4, wherein, between the delay circuit and the additional modulator, a correction circuit is arranged which, in particular, compensates for nonlinearities of the RF output stage and of the additional modulator and predetermines a starting point for the additional modulation of the carrier signal in the additional modulator (18), from which this modulation starts.

7. Amplitude modulated broadcast transmitter as claimed in claim 6, wherein a correction circuit is constructed as nonlinear amplifier which essentially picks from the LF input signal the narrow negative peaks which it shapes and forwards to the additional modulator.

8. Amplitude modulated broadcast transmitter as claimed in claim 4, wherein the delay circuit is constructed as combination of a 3-stage active low-pass filter and an adjustable all-pass filter.

9. Amplitude modulated broadcast transmitter as claimed in claim 2, wherein the additional modulator is constructed as two-stage controllable attenuator with a dual field effect transistor and a subsequent impedance converter.

* * * * *